United States Patent
Liao et al.

(10) Patent No.: US 9,960,187 B2
(45) Date of Patent: May 1, 2018

(54) ELECTRICAL CONNECTION STRUCTURE AND THIN FILM TRANSISTOR ARRAY SUBSTRATE INCLUDING ELECTRICAL CONNECTION STRUCTURE

(71) Applicant: HON HAI PRECISION INDUSTRY CO., LTD., New Taipei (TW)

(72) Inventors: Chin-Yueh Liao, New Taipei (TW); Chia-Lin Liu, New Taipei (TW); Yan-Tang Dai, New Taipei (TW); Hung-Che Lu, New Taipei (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 0 days. days.

(21) Appl. No.: 15/139,552

(22) Filed: Apr. 27, 2016

(65) Prior Publication Data

US 2016/0351596 A1 Dec. 1, 2016

(30) Foreign Application Priority Data

May 29, 2015 (TW) .............................. 104117273 A

(51) Int. Cl.
*H01L 27/12* (2006.01)
*H01L 29/45* (2006.01)
*H01L 29/49* (2006.01)
*H01L 29/786* (2006.01)

(52) U.S. Cl.
CPC ........ *H01L 27/1222* (2013.01); *H01L 27/124* (2013.01); *H01L 29/458* (2013.01); *H01L 29/495* (2013.01); *H01L 29/4908* (2013.01); *H01L 29/78633* (2013.01); *H01L 29/78669* (2013.01); *H01L 29/78678* (2013.01)

(58) Field of Classification Search
CPC .................... H01L 29/78678; H01L 29/78669
See application file for complete search history.

(56) References Cited

U.S. PATENT DOCUMENTS

| | | | | |
|---|---|---|---|---|
| 2009/0050894 A1* | 2/2009 | Park | ...................... | H01L 29/458 257/72 |
| 2012/0074413 A1* | 3/2012 | Kim | .................... | H01L 51/5271 257/59 |
| 2013/0313554 A1* | 11/2013 | Murai | ................ | G01N 27/4141 257/53 |
| 2014/0183472 A1* | 7/2014 | Kim | .................... | H01L 27/3258 257/40 |

* cited by examiner

*Primary Examiner* — Mounir Amer
(74) *Attorney, Agent, or Firm* — ScienBiziP, P.C.

(57) ABSTRACT

An electrical connection structure providing better optical properties in a display includes an electrical connection unit, an interference layer, and an electrically insulating cover. The interference layer is positioned on a side of the electrical connection unit. The electrically insulating cover is positioned on the other side of the electrical connection unit and formed to cover the electrical connection unit. The electrical connection unit includes a metal layer to reflect light. The interference layer can reflect light falling on a first region close to the electrically insulating cover. A degree of reflectance of the first region of the interference layer is equal to the reflectance of the metal layer.

13 Claims, 16 Drawing Sheets

//www.w3.org/1998/Math/MathML
ELECTRICAL CONNECTION STRUCTURE AND THIN FILM TRANSISTOR ARRAY SUBSTRATE INCLUDING ELECTRICAL CONNECTION STRUCTURE

CROSS-REFERENCE TO RELATED APPLICATIONS

This application claims priority to Taiwan Patent Application No. 104117273 filed on May 29, 2015, the contents of which are incorporated by reference herein.

FIELD

The subject matter herein generally relates to electrical connection structures and a thin film transistor (TFT) array substrate that includes an electrical connection structure.

BACKGROUND

A thin film transistor liquid crystal display (TFT LCD) includes a TFT array substrate, a color filter over the TFT LCD, and a liquid crystal layer between the TFT array substrate and the color filter. The TFT array substrate can control rotations of liquid crystals in the liquid crystal layer and thus display a picture or shape through the color filter. The TFT array substrate includes electronic components such as thin film transistors, capacitors, connection pads, and connection lines. After the electronic components are formed, an electrically insulating cover is formed to cover the electronic components. Thereafter, the electrical insulating cover is subjected to light exposure through a mask. The light exposure can impart optical qualities to the surface of the electrically insulating cover which are less than optimal, which adversely affects performance and reliability of the TFT array substrate.

BRIEF DESCRIPTION OF THE DRAWINGS

Many aspects of the disclosure can be better understood with reference to the following drawings. The components in the drawings are not necessarily drawn to scale, the emphasis instead being placed upon clearly illustrating the principles of the disclosure. Moreover, in the drawings, like reference numerals designate corresponding parts throughout the several views.

DETAILED DESCRIPTION

Figure 1:
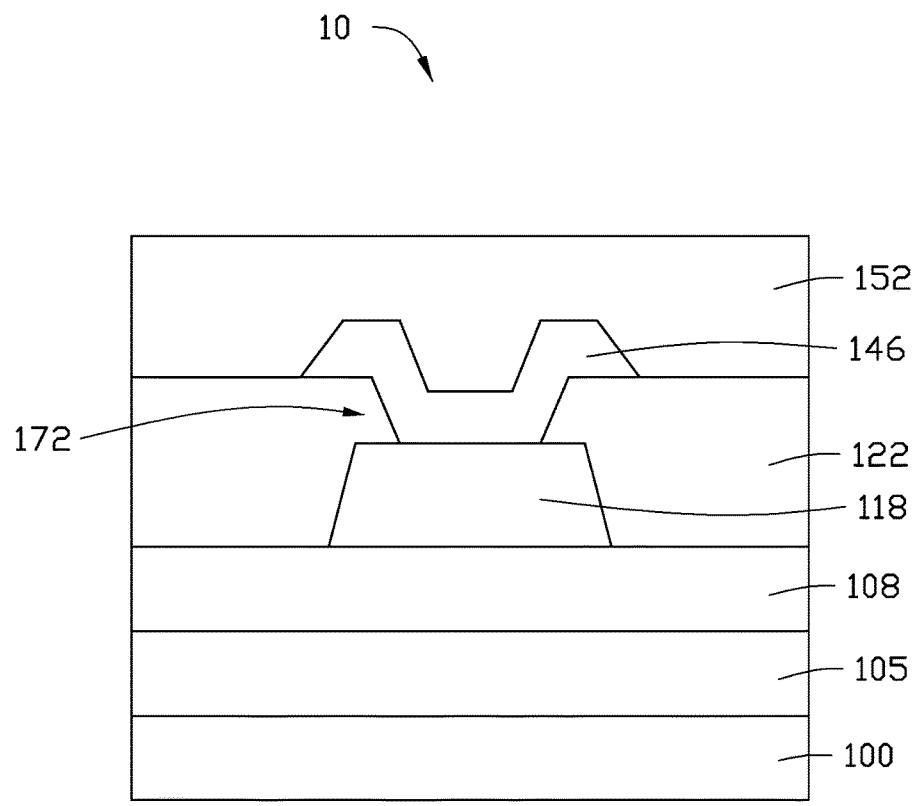
FIG. 1 is a cross-sectional view of an electrical connection structure of the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "comprising," when utilized, means "including, but not necessarily limited to"; it specifically indicates open-ended inclusion or membership in the so-described combination, group, series and the like.

The disclosure will now be described in relation to an electrical connection structure.

FIG. 1 illustrates an electrical connection structure 10 comprising a substrate 100, a buffer layer 105, an interference layer 108, a connection pad 118, an electrically insulating layer 122, a connection line 146, and an electrically insulating cover 152.

The buffer layer 105 is formed on the substrate 100, the interference layer 108 is formed on the buffer layer 105, and the connection pad 118 is formed on the interference layer 108. The electrically insulating layer 122 is formed to cover the interference layer 108 and the connection pad 118. A connection hole 172 is defined in the electrically insulating layer 122 at a position corresponding to the connection pad 118. The connection line 146 is formed on the electrically insulating layer 122. The connection line 146 extends through the connection hole 172 to electrically connect with the connection pad 118. An electrical connection unit comprises the connection line 146 and the connection pad 118.

The electrically insulating cover 152 is formed to cover the electrically insulating layer 122 and the connection line 146. A surface of the electrically insulating cover 152 is a flat surface away from the substrate 100.

The interference layer 108 is able to reflect light emitted from a first side of the interference layer 108 away from the substrate 100 towards the interference layer 108 and transmit light emitted from a second side of the interference layer 108 adjacent to the substrate 100 towards the interference layer 108. The connection line 146 can reflect light. A reflectance of the first side of the interference layer 108 is equal to a reflectance of the connection line 146. The interference layer 108 occupies an area which is not less than an area occupied by the electrical connection unit. In this embodiment, the interference layer 108 occupies an area which is not less than an area occupied by the connection line 146. Moreover, the interference layer 108 occupies a size of area which is between one and ten times greater in size than the area occupied by the electrical connection unit. In this embodiment, the interference layer 108 occupies a size of area which is between one and ten times greater in size than the area occupied by the connection line 146.

In other embodiments, the buffer layer 105 can be omitted, and the interference layer 108 can be directly formed on the substrate 100.

According to this embodiment, the substrate 100 can be made of transparent material such as glass, quartz, or organic polymer. The buffer layer 105 can be made of transparent and electrically insulating material such as silicon oxide, silicon nitride, or silicon oxynitride. The interference layer 108 can be made of a polymer comprising niobium oxide and silicon dioxide ($Nb_2O_5$-$SiO_2$). The connection pad 118 can be made of metal such as aluminum, titanium, molybdenum, tantalum, or copper. The connection line 146 can be made of metal such as aluminum, titanium, molybdenum, tantalum, or copper. The electrically insulating layer 122 can be made of transparent and insulating material such as aluminum oxide, silicon oxide, silicon nitride, or silicon oxynitride. The electrically insulating cover 152 is a passivation layer and can be made of organic material such as polycarbonate (PC) or benzocyclobutene (BCB).

The electrical connection structure 10 comprises the connection line 146 and the interference layer 108. The reflectance of the first region of the interference layer 108 is equal to the reflectance of the connection line 146, and the area occupied by the interference layer 108 is not less in size than the area occupied by the connection line 146. The interference layer 108 interferes with the light reflected by the connection line 146, thus when the electrically insulating cover 152 is exposed to light irradiation, a region of the electrically insulating cover 152 corresponding to the connection line 146 receives a lesser irradiation of light. Thus, the surface of the electrically insulating cover 152 can be kept largely flat and smooth with less of the roughness which otherwise affects the optical qualities.

The disclosure will now be described in relation to a TFT array substrate 1 with an electrical connection structure 10.

Figure 2:
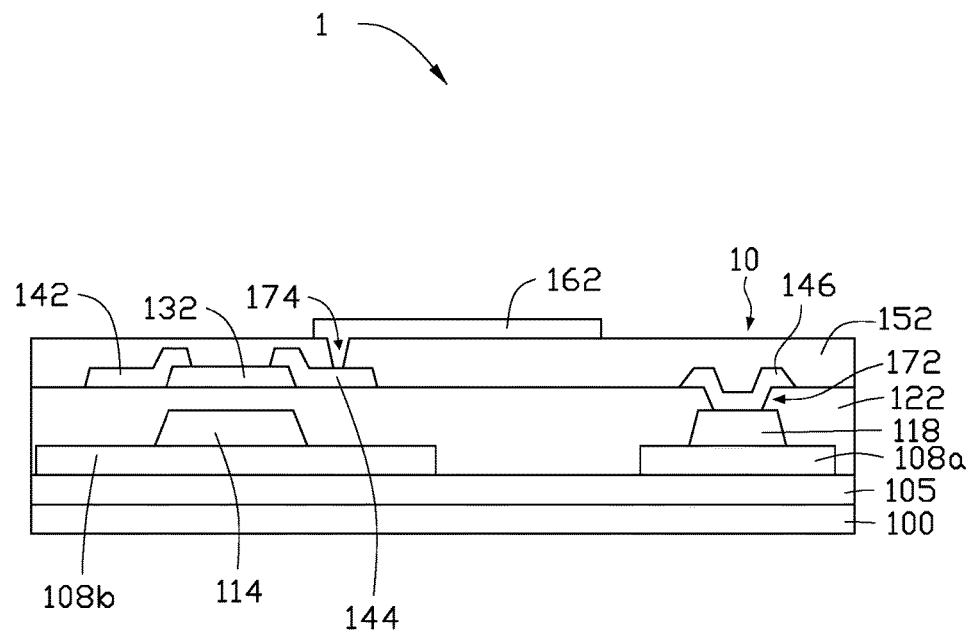
FIG. 2 is a cross-sectional view of a TFT array substrate with an electrical connection structure of the present disclosure.

According to this embodiment, an electrical connection structure 10 is formed on a non-display area of the TFT array substrate 1. FIG. 2 illustrates a TFT array substrate 1 comprising a substrate 100, a buffer layer 105, an first interference layer 108a, an second interference layer 108b, a gate electrode 114, a connection pad 118, an electrically insulating layer 122, a channel layer 132, a source electrode 142, a drain electrode 144, a connection line 146, an electrically insulating cover 152, and a pixel electrode 162.

The buffer layer 105 is formed on the substrate 100. The first interference layer 108a and the second interference layer 108b are formed on the buffer layer 105 and the first interference layer 108a and the second interference layer 108b are separated by a distance. The connection pad 118 is formed on the first interference layer 108a. The gate electrode 114 is formed on the second interference layer 108b. The electrically insulating layer 122 is formed to cover the buffer layer 105, the first interference layer 108a, the second interference layer 108b, the gate electrode 114, and the connection pad 118. A connection hole 172 is defined in the electrically insulating layer 122 at a position corresponding to the connection pad 118. The channel layer 132 is formed on the electrically insulating layer 122 at a location corresponding to the gate electrode 114. The source electrode 142 and the drain electrode 144 are formed on the electrically insulating layer 122 to cover two opposite ends of the channel layer 132. The connection line 146 is formed on the electrically insulating layer 122. The connection line 146 extends through the connection hole 172 to electrically connect with the connection pad 118. An electrical connection unit comprises the connection line 146 and the connection pad 118. A thin film transistor (TFT) comprises the gate electrode 114, the channel layer 132, the source electrode 142, and the drain electrode 144. The electrically insulating cover 152 is formed to cover the electrically insulating layer 122, the source electrode 142, the channel layer 132, the drain electrode 144, and the connection line 146. A surface of the electrically insulating cover 152 is a flat surface away from the substrate 100. A contact hole 174 is defined in the electrically insulating cover 152 at a position corresponding to the drain electrode 144. The pixel electrode 162 is formed on the electrically insulating cover 152 and extends into the contact hole 174 to electrically couple with the drain electrode 144.

The first interference layer 108a is able to reflect light emitted from a first side of the first interference layer 108a away from the substrate 100 towards the first interference layer 108a and transmit light emitted from a second side of the first interference layer 108a adjacent to the substrate 100 towards the first interference layer 108a. The second interference layer 108b is able to reflect light emitted from a first side of the second interference layer 108b away from the substrate 100 towards the second interference layer 108b and transmit light emitted from a second side of the second interference layer 108b adjacent to the substrate 100 towards the second interference layer 108b. The connection line 146 can reflect light. A reflectance of the first side of each of the interference layers 108a, 108b is equal to a reflectance of the connection line 146. In this embodiment, the first interference layer 108a occupies a size of area which is not less than the size of area occupied by the connection line 146. The second interference layer 108b occupies an area which is not less in size than the area occupied by the channel layer 132, the source electrode 142, and the drain electrode 144 combined. Moreover, the first interference layer 108a occupies a size of area which is between one and ten times greater in size than the area occupied by the connection line 146. The second interference layer 108b occupies a size of area which is between one and ten times greater in size than the area occupied by the channel layer 132, the source electrode 142, and the drain electrode 144 combined.

In other embodiments, the buffer layer 105 can be omitted, and the interference layer 108 can be directly formed on the substrate 100.

In this embodiment, the substrate 100 can be made of transparent material such as glass, quartz, or organic polymer. The buffer layer 105 can be made of transparent and electrically insulating material such as silicon oxide, silicon nitride, or silicon oxynitride. The interference layer 108 can be made of a polymer comprising niobium oxide and silicon dioxide (Nb2O5-SiO2). The gate, source, and drain electrodes 114, 142, and 144, the connection pad 118, and the connection line 146 can be made of metal such as aluminum, titanium, molybdenum, tantalum, or copper. The electrically insulating layer 122 can be made of transparent and insulating material such as aluminum oxide, silicon oxide, silicon nitride, or silicon oxynitride. The electrically insulating cover 152 is a passivation layer and can be made of organic material such as polycarbonate (PC) or benzocyclobutene (BCB). The pixel electrode 162 can be made of indium tin oxide (ITO).

The TFT array substrate 1 comprises the connection line 146, the first interference layer 108a, and the second interference layer 108b. The reflectance of the first region of the first interference layer 108a is equal to the reflectance of the connection line 146, and the size of area occupied by the first interference layer 108a is not less than the size of area occupied by the connection line 146. The reflectance of the first region of the second interference layer 108b is equal to the reflectance of the source and drain electrodes 142, and 144, and the size of area occupied by the second interference layer 108b is not less than the size of area occupied by the channel layer 132, the source electrode 142, and the drain electrode 144 combined. The first interference layer 108a and the second interference layer 108b interfere with the light reflected by the connection line 146 and by the source and drain electrodes 142, and 144, such that when the electrically insulating cover 152 is exposed to light, a region of the electrically insulating cover 152 corresponding to the connection line 146 and the source and drain electrodes 142, and 144 has less irradiation of light. Thus, roughness on the surface of the electrically insulating cover 152 can be reduced.

Figure 3:
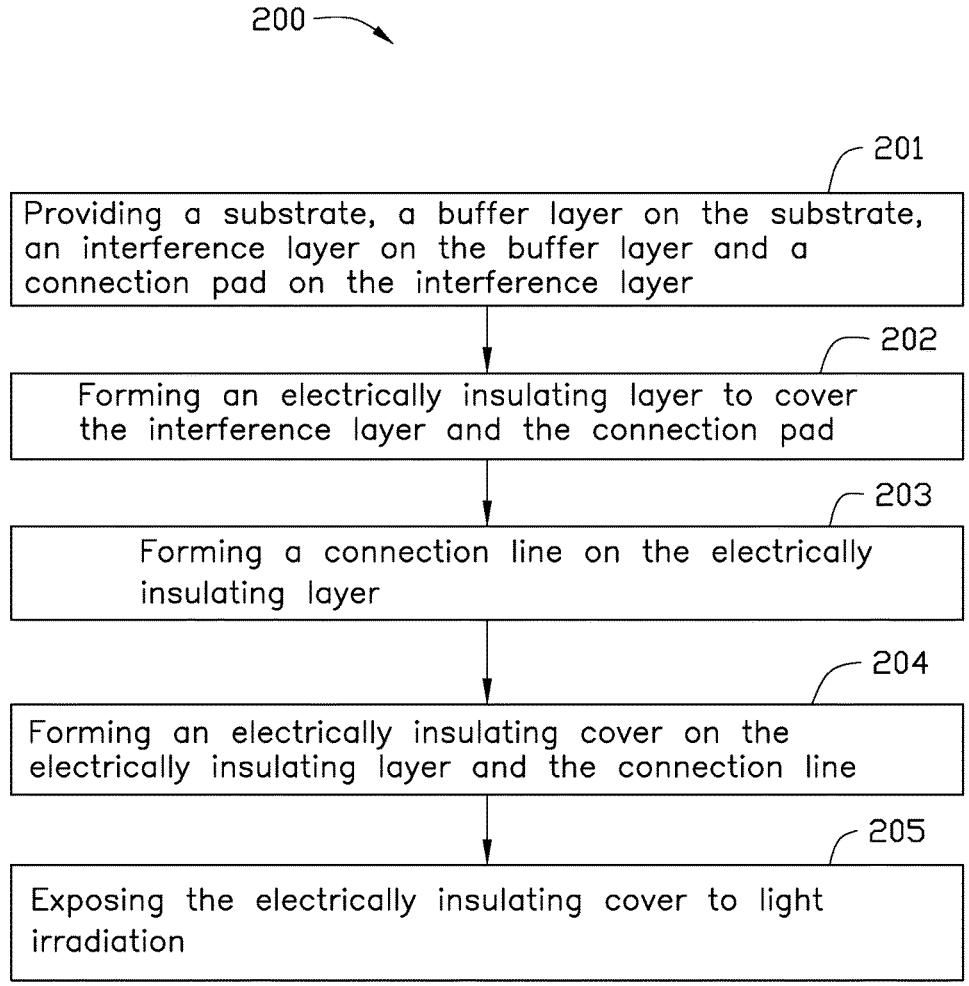
FIG. 3 is a flowchart showing a method for manufacturing an electrical connection structure of the present disclosure.

Referring to FIG. 3, a flowchart is presented in accordance with an example embodiment. The example method 200 is provided by way of example, as there are a variety of ways to carry out the method. The method 200 described below can be carried out using the configurations illustrated in FIGS. 4-8, for example, and various elements of these figures are referenced in explaining example method 200. Each block shown in FIG. 3 represents one or more processes, methods, or subroutines carried out in the example method 200. Furthermore, the order of blocks is illustrative only and the order of the blocks can change. Additional blocks can be added or fewer blocks may be utilized without departing from this disclosure. The example method 200 for manufacturing an electrical connection structure 10 can begin at block 201.

Figure 4:
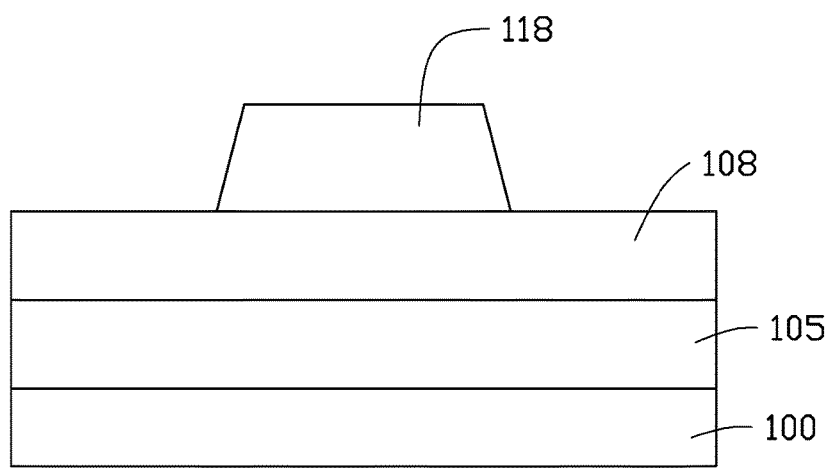
FIG. 4 is a cross-sectional view of a part of an electrical connection structure corresponding to a first block of the method of FIG. 3.

Also referring to FIG. 4, at block 201, a substrate 100 is provided. A buffer layer 105 is formed on the substrate 100, an interference layer 108 is formed on the buffer layer 105, and a connection pad 118 is formed on the interference layer 108.

In more detail, block 201 includes forming the buffer layer 105 on the substrate 100, forming the interference layer 108 on the buffer layer 105 and then forming a metal layer on the interference layer 108. The metal layer is then patterned through photolithography under a yellow light environment to form the connection pad 118.

According to this embodiment, the substrate 100 can be made of transparent material such as glass, quartz, or organic polymer. The buffer layer 105 can be made of transparent and electrically insulating material such as silicon oxide, silicon nitride, or silicon oxynitride. The interference layer 108 can be made of a polymer comprising niobium oxide and silicon dioxide (Nb2O5-SiO2). The interference layer 108 can reflect light emitted from a first side of the interference layer 108 away from the substrate 100 towards the interference layer 108 and can transmit light emitted from a second side of the interference layer 108 adjacent to the substrate 100 towards the interference layer 108. The connection pad 118 can be made of metal such as aluminum, titanium, molybdenum, tantalum, or copper.

It can be understood that the buffer layer 105 can be omitted; then the interference layer 108 can be directly formed on the substrate 100.

Figure 5:
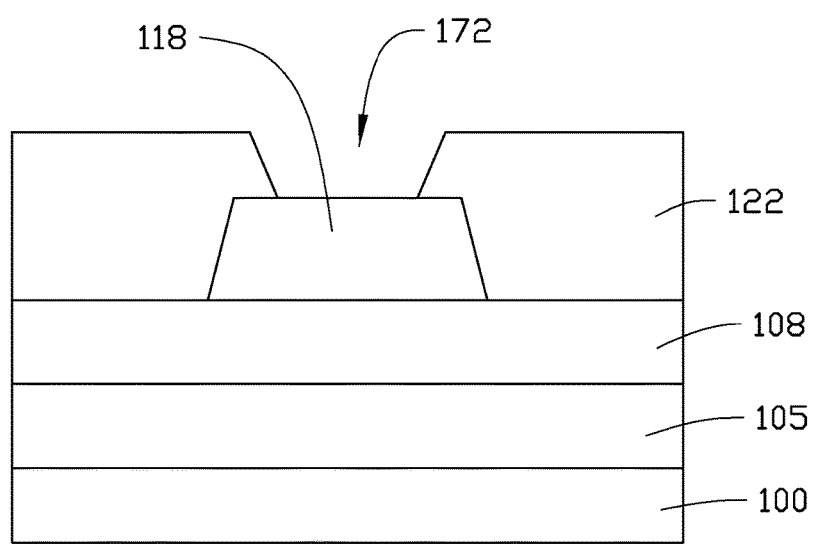
FIG. 5 is a cross-sectional view of a part of an electrical connection structure corresponding to a second block of the method of FIG. 3.

Also referring to FIG. 5, at block 202, an electrically insulating layer 122 is formed to cover the interference layer 108 and the connection pad 118. A connection hole 172 is defined in electrically insulating layer 122 at a position corresponding to the connection pad 118.

In more detail, the connection hole 172 is formed through photolithography to the electrically insulating layer 122 in a yellow light environment.

In this embodiment, the electrically insulating layer 122 can be made of transparent and insulating material such as aluminum oxide, silicon oxide, silicon nitride, or silicon oxynitride.

Figure 6:
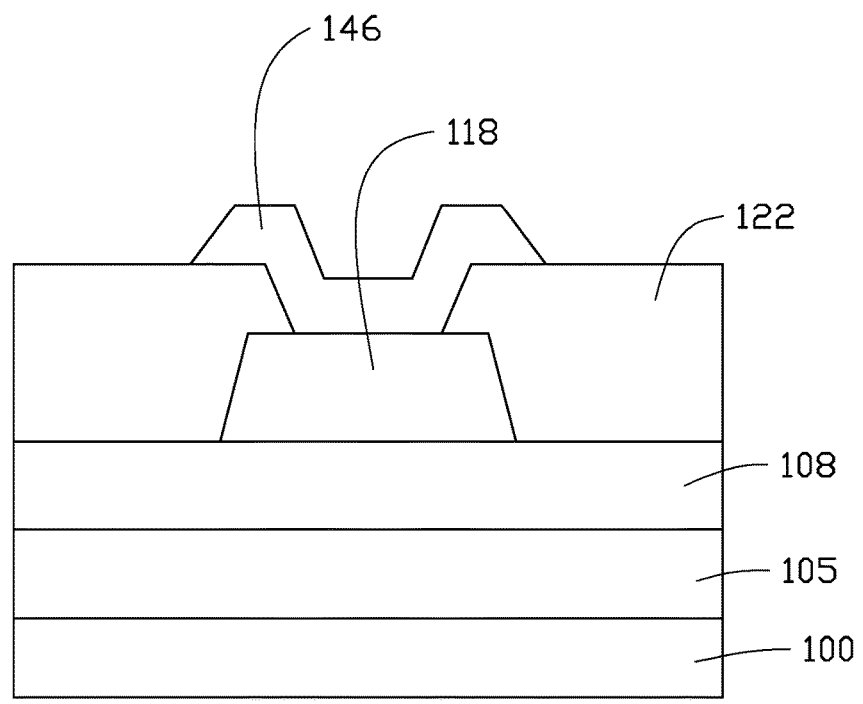
FIG. 6 is a cross-sectional view of a part of an electrical connection structure corresponding to a third block of the method of FIG. 3.

Also referring to FIG. 6, at block 203, a connection line 146 is formed on the electrically insulating layer 122. The connection line 146 extends through the connection hole 172 to electrically connect with the connection pad 118. In this embodiment, the connection line 146 is formed by firstly applying a metal layer on the electrically insulating layer 122. Then the metal layer is processed by photolithography under a yellow light environment to form the connection line 146. A reflectance of the connection line 146 is equal to a reflectance of the first region of the interference layer 108. The connection line 146 can be made of aluminum, titanium, molybdenum, tantalum, or copper which can reflect light impinges thereon.

Figure 7:
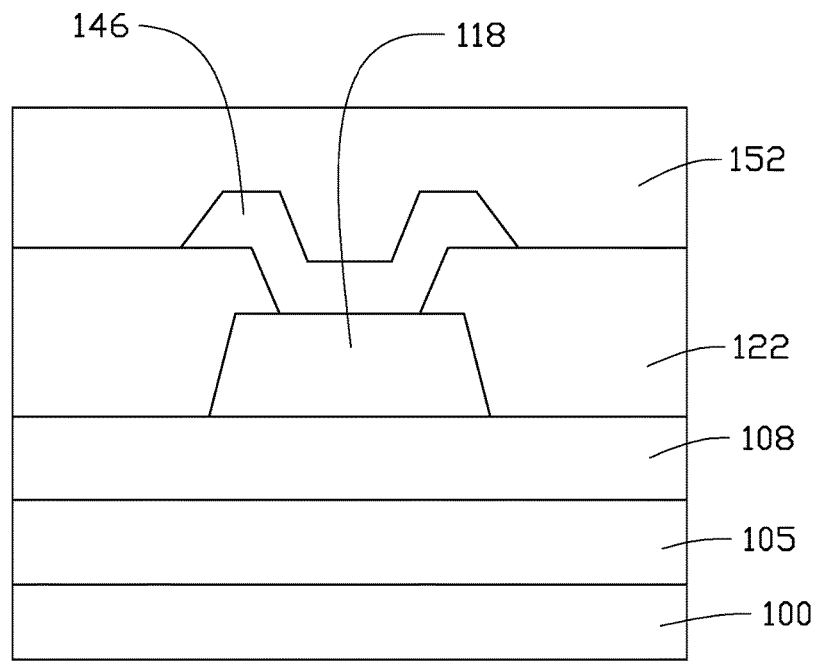
FIG. 7 is a cross-sectional view of a part of an electrical connection structure corresponding to a fourth block of the method of FIG. 3.

Also referring to FIG. 7, at block 204, an electrically insulating cover 152 is formed on the electrically insulating layer 122 and the connection line 146. A surface of the electrically insulating cover 152 is a flat surface away from the substrate 100. The electrically insulating cover 152 is a passivation layer and can be made of organic material such as polycarbonate (PC) or benzocyclobutene (BCB).

Figure 8:
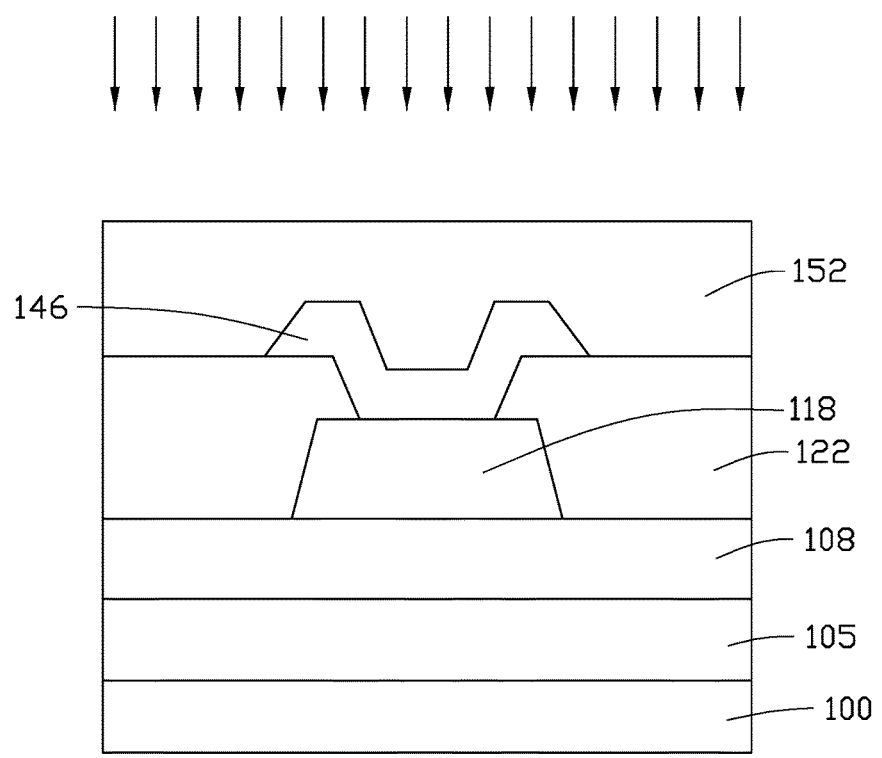
FIG. 8 is a cross-sectional view of a part of an electrical connection structure corresponding to a fifth block of the method of FIG. 3.

Also referring to FIG. 8, at block 205, the electrically insulating cover 152 is exposed to light irradiation. The light impinges on the connection line 146 through the electrically insulating cover 152, and the light impinges on the interference layer 108 through the electrically insulating cover 152 and the electrically insulating layer 122. The connection line 146 and the interference layer 108 can reflect the light to the electrically insulating cover 152 respectively. According to the reflectance of the connection line 146 is equal to the reflectance of the first region of the interference layer 108, the light reflected by the interference layer 108 and the connection line 146 can interfere with each other. The electrically insulating cover 152 has less light reflected from the interference layer 108 and the connection line 146. Thus, the surface of the electrically insulating cover 152 can be kept largely flat and smooth with less of the roughness which otherwise affects the optical qualities. Accordingly, manufacturing of the electrical connection structure 10 is complete.

Figure 9:
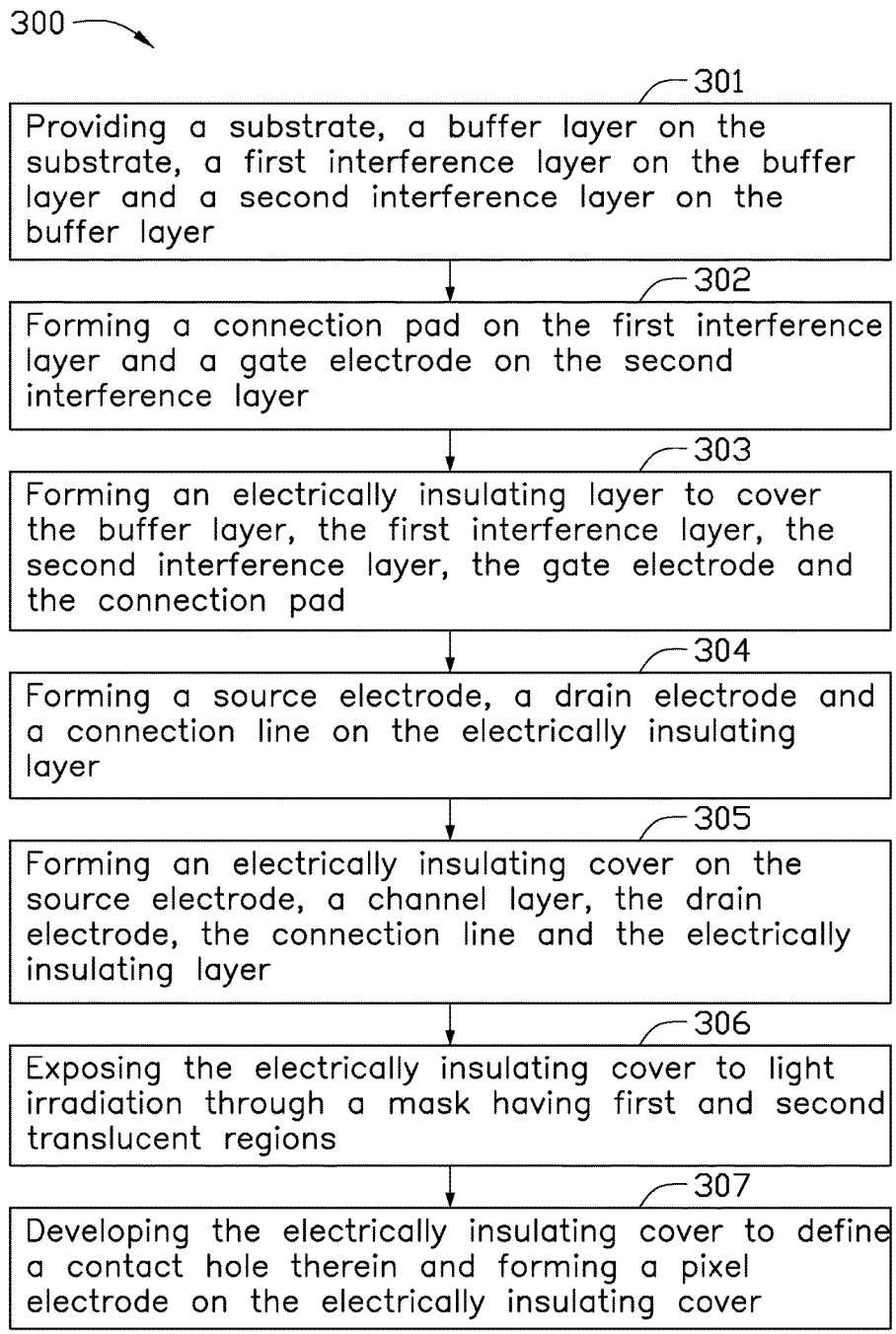
FIG. 9 is a flowchart showing a method for manufacturing a TFT array substrate with an electrical connection structure of the present disclosure.

Referring to FIG. 9, a flowchart is presented in accordance with an example embodiment. The example method 300 is provided by way of example, as there are a variety of ways to carry out the method. The method 300 described below can be carried out using the configurations illustrated in FIGS. 10-16, for example, and various elements of these figures are referenced in explaining example method 300. Each block shown in FIG. 9 represents one or more processes, methods or subroutines, carried out in the example method 300. Furthermore, the illustrated order of blocks is illustrative only and the order of the blocks can change according to the present disclosure. Additional blocks can be added or fewer blocks may be utilized, without departing from this disclosure. The example method 300 for manufacturing a TFT array substrate 1 with an electrical connection structure 10 can begin at block 301.

Figure 10:
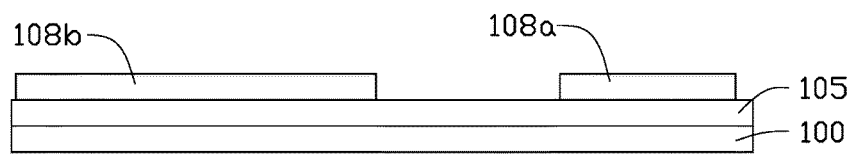
FIG. 10 is a cross-sectional view of a part of a TFT array substrate with an electrical connection structure corresponding to a first block of the method of FIG. 9.

Also referring to FIG. 10, at block 301, a substrate 100 is provided. A buffer layer 105 is formed on the substrate 100, and a first interference layer 108a and a second interference layer 108b are formed on the buffer layer 105.

In more detail, block 301 includes forming the buffer layer 105 on the substrate 100, and forming an interference layer 108 on the buffer layer 105. The interference layer 108 is then patterned through photolithography under a yellow light environment to form the first interference layer 108a and the second interference layer 108b.

According to this embodiment, the substrate 100 can be made of transparent material such as glass, quartz, or organic polymer. The buffer layer 105 can be made of transparent and electrically insulating material such as silicon oxide, silicon nitride, or silicon oxynitride. The first interference layer 108a and the second interference layer 108b can be made of a polymer comprising niobium oxide and silicon dioxide (Nb2O5-SiO2). The first interference layer 108a can reflect light emitted from a first side of the first interference layer 108a away from the substrate 100 towards the first interference layer 108a and can transmit light emitted from a second side of the first interference layer 108a adjacent to the substrate 100 towards the first interference layer 108a. The second interference layer 108b can reflect light emitted from a first side of the second interference layer 108b away from the substrate 100 towards the second interference layer 108b and can transmit light emitted from a second side of the second interference layer 108b adjacent to the substrate 100 towards the second interference layer 108b.

It can be understood that the buffer layer 105 can be omitted; then the first interference layer 108a and the second interference layer 108b can be directly formed on the substrate 100.

Figure 11:
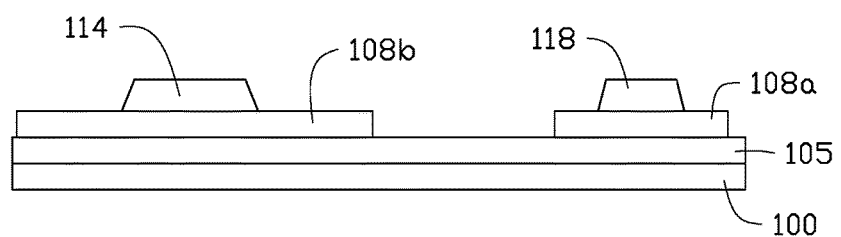
FIG. 11 is a cross-sectional view of a part of a TFT array substrate with an electrical connection structure corresponding to a second block of the method of FIG. 9.

Also referring to FIG. 11, at block 302, a connection pad 118 is formed on the first interference layer 108a, and a gate electrode 114 is formed on the second interference layer 108b.

In more detail, block 302 includes forming a metal layer on the interference buffer layer 105, the first interference layer 108a and the second interference layer 108b.

The metal layer is then patterned through photolithography under a yellow light environment to form the gate electrode 114 and the connection pad 118.

In this embodiment, the gate electrode 114 and the connection pad 118 can be made of metal such as aluminum, titanium, molybdenum, tantalum, or copper.

Figure 12:
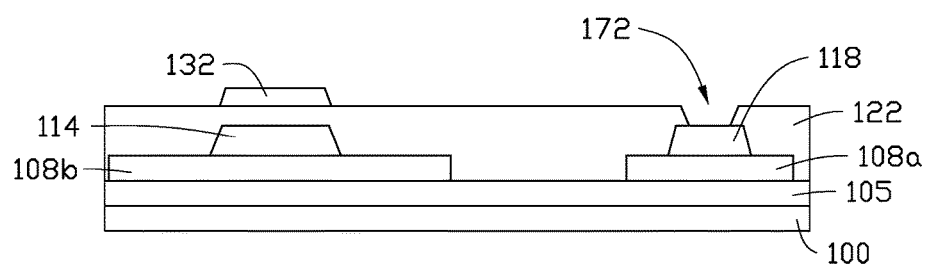
FIG. 12 is a cross-sectional view of a part of a TFT array substrate with an electrical connection structure corresponding to a third block of the method of FIG. 9.

Also referring to FIG. 12, at block 303, an electrically insulating layer 122 is formed to cover the buffer layer 105, the first interference layer 108a, the second interference layer 108b, the gate electrode 114, and the connection pad 118. A channel layer 132 is formed on the electrically insulating layer 122 at a location corresponding to the gate electrode 114. A connection hole 172 is defined in electrically insulating layer 122 at a position corresponding to the connection pad 118 whereby the connection pad 118 is exposed through the connection hole 172.

In more detail, block 303 includes forming the electrically insulating layer 122 on the interference buffer layer 105, the first interference layer 108a, the second interference layer 108b, the gate electrode 114, and the connection pad 118. To form the channel layer 132 and the connection hole 172, first a semiconductor layer is applied on the electrically insulating layer 122. Then the semiconductor layer is processed by photolithography under a yellow light environment to form the channel layer 132. The photolithography also patterns the electrically insulating layer 122 to form the connection hole 172.

In this embodiment, the electrically insulating layer 122 can be made of transparent and insulating material such as aluminum oxide, silicon oxide, silicon nitride, or silicon oxynitride. The channel layer 132 can be made of semiconductor material such as metal oxide, amorphous silicon, or polycrystalline silicon (also called polysilicon).

Figure 13:
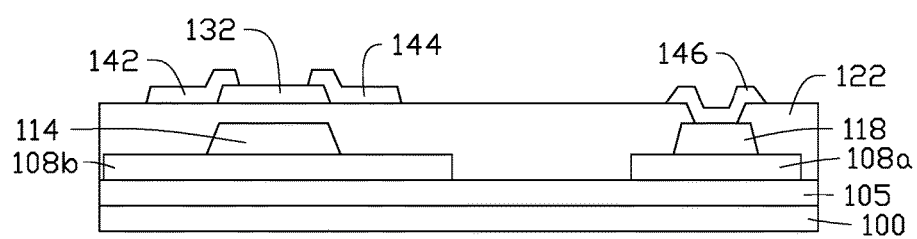
FIG. 13 is a cross-sectional view of a part of a TFT array substrate with an electrical connection structure corresponding to a fourth block of the method of FIG. 9.

Also referring to FIG. 13, at block 304, a source electrode 142, a drain electrode 144 and a connection line 146 are formed on the electrically insulating layer 122. The source electrode 142 and the drain electrode 144 are formed on the electrically insulating layer 122 to cover two opposite ends of the channel layer 132. The connection line 146 extends through the connection hole 172 to electrically connect with the connection pad 118.

In more detail, block 304 includes forming a metal layer on the electrically insulating layer 122 and the channel layer 132. The metal layer is then patterned through photolithography under a yellow light environment to form the source electrode 142, the drain electrode 144 and the connection line 146.

In this embodiment, the source electrode 142, the drain electrode 144 and the connection line 146 can be made of metal such as aluminum, titanium, molybdenum, tantalum, or copper. The first interference layer 108a can reflect light falling on a first region of the first interference layer 108a away from the substrate 100. The second interference layer 108b can reflect light falling on a first region of the second interference layer 108b away from the substrate 100. A reflectance of the first region of each of the interference layers 108a, 108b is equal to a reflectance of the source electrode 142, the drain electrode 144 and the connection line 146.

Figure 14:
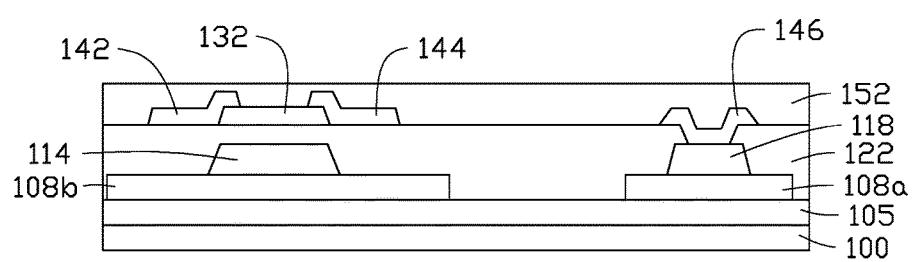
FIG. 14 is a cross-sectional view of a part of a TFT array substrate with an electrical connection structure corresponding to a fifth block of the method of FIG. 9.

Also referring to FIG. 14, at block 305, an electrically insulating cover 152 is formed on the source electrode 142, the channel layer 132, the drain electrode 144, the connection line 146 and the electrically insulating layer 122. A surface of the electrically insulating cover 152 is a flat surface away from the substrate 100.

In this embodiment, the electrically insulating cover 152 is a passivation layer and can be made of organic material such as polycarbonate (PC) or benzocyclobutene (BCB).

Figure 15:
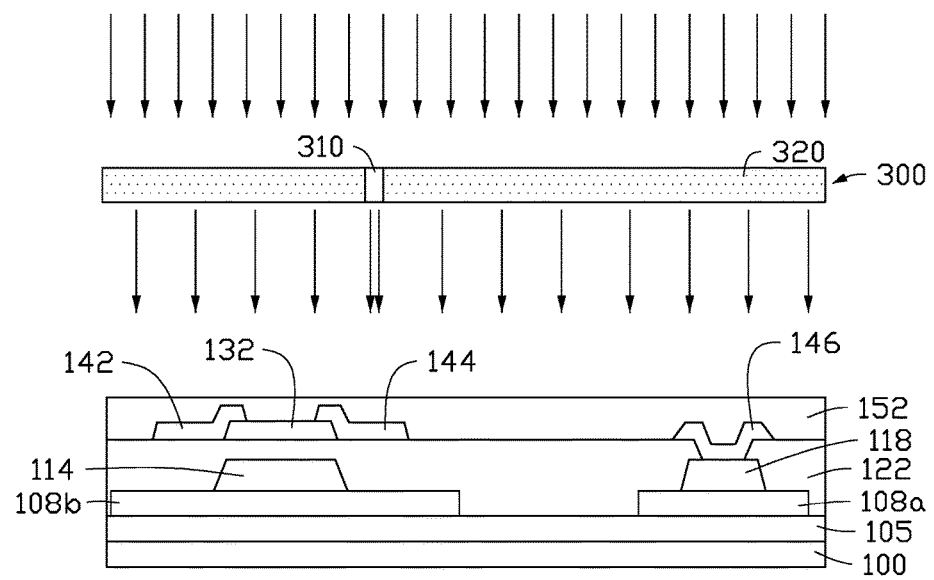
FIG. 15 is a cross-sectional view of a part of a TFT array substrate with an electrical connection structure corresponding to a sixth block of the method of FIG. 9.

Also referring to FIG. 15, at block 306, the electrically insulating cover 152 is exposed to light irradiation through a mask 300. The mask 300 has a first translucent region 310 located corresponding to a region of the electrically insulating cover 152 in which the drain electrode 144 is formed, and a second translucent region 320 located corresponding to a region of the electrically insulating cover 152 beside the first translucent region 310. A transmittance of the second translucent region 320 is lower than a transmittance of the first translucent region 310.

After being irradiated by light which can be ultraviolet light, the part of the electrically insulating cover 152 which corresponds to the first translucent region 310 and can absorb the highest intensity of light irradiation can be removed by a photoresist developer (not shown). The region of the electrically insulating cover 152 corresponding to the second translucent region 320 of the mask 300 is passivated to increase its transmittance. The light impinges on the connection line 146 through the electrically insulating cover 152, and the light impinges on the first interference layer 108a through the electrically insulating cover 152 and the electrically insulating layer 122. The connection line 146 and the first interference layer 108a can reflect the light to the electrically insulating cover 152 respectively. According to the reflectance of the connection line 146 is equal to the reflectance of the first region of the first interference layer 108a, the light reflected by the first interference layer 108a and the connection line 146 can interfere with each other. The electrically insulating cover 152 has less light reflected from the first interference layer 108a and the connection line 146. Thus, roughness on the surface of the electrically insulating cover 152 can be reduced. Accordingly, the electrically insulating cover 152 has less light reflected from the second interference layer 108b, the source electrode 142 and the drain electrode 144. The surface of the electrically insulating cover 152 can be kept flat and smooth.

Figure 16:
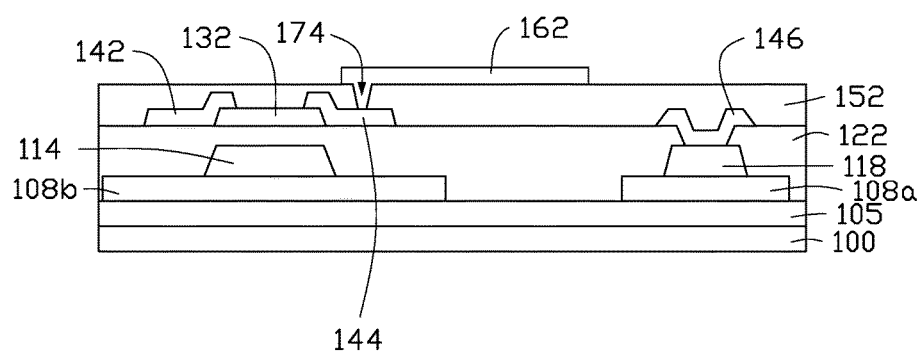
FIG. 16 is a cross-sectional view of a part of a TFT array substrate with an electrical connection structure corresponding to a seventh block of the method of FIG. 9.

Referring to FIG. 16, at block 307, a contact hole 174 is defined in the electrically insulating cover 152 at a position corresponding to the first translucent region 310. A pixel electrode 162 is formed on the electrically insulating cover 152 and extends into the contact hole 174 to electrically couple with the drain electrode 144.

In more detail, by the photoresistor developer, the contact hole 174 is formed in the electrically insulating cover 152 at the position corresponding to the first translucent region 310. The pixel electrode 162 is formed by applying a transparent, electrically conductive layer on the electrically insulating cover 152 and then patterning the transparent, electrically conductive layer by photolithography to obtain the pixel electrode 162. The pixel electrode 162 can be made of indium tin oxide (ITO). Accordingly, manufacturing of the TFT array substrate 1 is complete.

The embodiments shown and described above are only examples. Even though numerous characteristics and advantages of the present technology have been set forth in the foregoing description, together with details of the structure and function of the present disclosure, the disclosure is illustrative only, and changes may be made in the details, including matters of shape, size, and arrangement of the parts within the principles of the present disclosure, up to and including the full extent established by the broad general meaning of the terms used in the claims.

What is claimed is:
1. A TFT array substrate comprising:
   a thin film transistor;
   a second interference layer positioned on a side of the thin film transistor; and
   an electrically insulating cover positioned on the other side of the thin film transistor away from the second interference layer and formed to cover the thin film transistor;
   wherein the thin film transistor comprises a metal layer reflecting light, and wherein the thin film transistor is located between the second interference layer and the electrically insulating cover; the second interference layer reflects light emitted from the electrically insulating cover towards a first side of the second interference layer, the first side of the second interference layer is adjacent to the electrically insulating cover, a reflectance of the first side of the second interference layer is equal to a reflectance of the metal layer.

2. The TFT array substrate of claim 1, wherein the second interference layer is formed on a substrate, the thin film transistor comprises a gate electrode, a channel layer, a source electrode and a drain electrode, and wherein the second interference layer occupies an area which is not less than an area occupied by the channel layer, the source electrode and the drain electrode combined.

3. The TFT array substrate of claim 2, wherein the second interference layer occupies a size of area which is between one and ten times greater in size than the area occupied by the channel layer, the source electrode and the drain electrode combined.

4. The TFT array substrate of claim 3, wherein the gate electrode, the source electrode and the drain electrode are made of a metal selected from at least one of a group consisting of aluminum, titanium, molybdenum, tantalum, and copper, and wherein the reflectance of the first side of the second interference layer is equal to the reflectance of the source electrode and drain electrode.

5. The TFT array substrate of claim 4, wherein the gate electrode is formed on the second interference layer, and wherein the TFT array substrate further comprises an electrically insulating layer formed to cover the gate electrode and the second interference layer, and wherein the channel layer is formed on the electrically insulating layer at a location corresponding to the gate electrode, and wherein the source electrode and the drain electrode are formed on the electrically insulating layer to cover two opposite ends of the channel layer, and the electrically insulating cover is formed to cover the source electrode, the drain electrode and the channel layer.

6. The TFT array substrate of claim 5, wherein the TFT array substrate further comprises an electrical connection structure formed on the TFT array substrate and a first interference layer formed on the substrate, and wherein the first interference layer reflects light emitted from the electrically insulating cover towards a first side of the first interference layer, the first side of the first interference layer is adjacent to the electrically insulating cover, a reflectance of the first side of the first interference layer is equal to the reflectance of the source electrode and drain electrode.

7. The TFT array substrate of claim 6, wherein the TFT array substrate further comprises an electrical connection unit, wherein the electrical connection unit comprises a connection line and a connection pad electrically connecting with the connection line, and wherein the connection line and the connection pad are made of a metal selected from at least one of a group consisting of aluminum, titanium, molybdenum, tantalum, and copper.

8. The TFT array substrate of claim 7, wherein the connection pad is formed on the first interference layer, and wherein the electrically insulating layer is formed to cover the connection pad, and wherein the connection line is formed on the electrically insulating layer and extends through a connection hole to electrically connect with the connection pad, and wherein the electrically insulating cover is formed to cover the connection line, and the reflectance of the first side of each of the interference layers is equal to a reflectance of the connection line.

9. The TFT array substrate of claim 8, wherein the first interference layer occupies an area which is not less than an area occupied by the connection line.

10. The TFT array substrate of claim 9, wherein the first interference layer occupies a size of area between one and ten times greater in size than the area occupied by the connection line.

11. The TFT array substrate of claim 10, wherein the first interference layer and the second interference layer are made of a polymer comprising niobium oxide and silicon dioxide.

12. The TFT array substrate of claim 6, wherein the first interference layer transmits light emitted from a second side of the first interference layer towards the second interference layer; the second side of the first interference layer is away from the electrically insulating cover.

13. The TFT array substrate of claim 1, wherein the second interference layer transmits light emitted from a second side of the second interference layer to the second interference layer; the second side of the second interference layer is away from the electrically insulating cover.

* * * * *